United States Patent
Shin

(10) Patent No.: US 7,363,554 B2
(45) Date of Patent: Apr. 22, 2008

(54) METHOD OF DETECTING ERRORS IN A PRIORITY ENCODER AND A CONTENT ADDRESSABLE MEMORY ADOPTING THE SAME

(75) Inventor: Ho-Geun Shin, Suwon-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 85 days.

(21) Appl. No.: 10/973,613

(22) Filed: Oct. 26, 2004

(65) Prior Publication Data
US 2005/0094451 A1 May 5, 2005

(30) Foreign Application Priority Data
Nov. 3, 2003 (KR) .................. 10-2003-0077393

(51) Int. Cl.
*G11C 29/00* (2006.01)
*G11C 7/00* (2006.01)
(52) U.S. Cl. .................. 714/718; 365/201
(58) Field of Classification Search ............ 714/718
See application file for complete search history.

(56) References Cited

U.S. PATENT DOCUMENTS

| | | | |
|---|---|---|---|
| 4,959,811 A | 9/1990 | Szczepanek | 365/49 |
| 6,430,072 B1 * | 8/2002 | Chadwick et al. | 365/49 |
| 6,539,324 B2 * | 3/2003 | Miyatake et al. | 702/117 |
| 6,609,222 B1 * | 8/2003 | Gupta et al. | 714/733 |
| 2004/0153911 A1 * | 8/2004 | Regev et al. | 714/718 |
| 2005/0050408 A1 * | 3/2005 | Kaginele | 714/718 |
| 2005/0120283 A1 * | 6/2005 | Harris et al. | 714/718 |

FOREIGN PATENT DOCUMENTS

JP          5-159584          6/1993

OTHER PUBLICATIONS

English Abstract Only.

* cited by examiner

*Primary Examiner*—Cynthia Britt
(74) *Attorney, Agent, or Firm*—F. Chau & Assoc., LLC

(57) ABSTRACT

A method of detecting errors in a priority encoder and a content addressable memory (CAM) adopting the same are provided. The CAM includes a CAM cell array, a priority encoder, and a shift register unit. The priority encoder tests the CAM cell array to determine if the CAM cell array has errors by comparing search data with data stored in the CAM cell array. The shift register unit, in response to a clock signal, transmits first through $m^{th}$ test data to the priority encoder to test the priority encoder. Then, the logic levels of the first through $m^{th}$ test data are sequentially changed in synchronization with the clock signal. If there are no errors in the priority encoder, the priority encoder sequentially outputs word line addresses of a most significant bit through a least significant bit of the CAM cell array.

13 Claims, 5 Drawing Sheets

METHOD OF DETECTING ERRORS IN A PRIORITY ENCODER AND A CONTENT ADDRESSABLE MEMORY ADOPTING THE SAME

CROSS-REFERENCE TO RELATED APPLICATION

This application claims priority to Korean Patent Application No. 2003-77393, filed on Nov. 3, 2003, in the Korean Intellectual Property Office, the disclosure of which is incorporated herein in its entirety by reference.

1. Technical Field

The present invention relates to a content addressable memory, and more particularly, to a method of detecting errors in a priority encoder and a content addressable memory adopting the same.

2. Discussion of the Related Art

Random access memories (RAMs) and read only memories (ROMs) use an address to indicate a specific location of a memory cell and to output data stored in the memory cell. On the other hand, content addressable memories (CAMs) receive external data, compare the received data with data stored therein to determine if the received data matches the stored data, and output an address in a memory cell in which data matching the received data is stored.

Each cell of a CAM includes comparison circuitry. Data inputted to a CAM is compared with data stored in all of its cells, and the output address indicates a matched result. CAMs are widely applied in fields that require quick retrieval of information such as a pattern, a list, and image data.

CAMs are classified as binary CAMs or ternary CAMs. General binary CAMs include RAM cells for storing two logic states '1' and '0'. A binary CAM includes a comparator, which compares external data (e.g., search data) with data stored in the RAM cells and, if the search data matches the stored data, sets a corresponding match line to a predetermined logic state. Examples of binary CAMs are disclosed in U.S. Pat. Nos. 4,646,271; 4,780,845; 5,490,102; and 5,495,382. The ternary CAMs may store three logic states of '1,' '0,' and 'don't care.' An example of a ternary CAM is disclosed in U.S. Pat. No. 5,319,590.

FIG. 1 illustrates the structure of a conventional CAM 100. As shown in FIG. 1, data is stored in a CAM cell array 110. Search data is transmitted from a search data/mask register 130 to the CAM cell array 110. Thereafter, the search data and the data stored in the CAM cell array 110 are compared. If the stored data matches the search data, the logic level of a match line (not shown) is set to either a high or low level. Then, a match line detection unit 150 detects the logic level of the match line. A priority encoder 160 receives an output from the match line detection unit 150 and outputs an address of a word line connected to CAM cells in which stored data matches the search data. If the priority encoder 160 outputs the word line address, then the CAM cells connected to the word line address do not have an error.

The CAM 100 generally uses the priority encoder 160 to determine if the CAM cell array 110 has an error. However, the priority encoder 160 also outputs the word line address of a least significant bit, when there are multiple word line addresses having a match between the search data and the stored data.

For example, it is assumed that one block of the CAM cell array 110 is composed of m×n cells ("m" denotes a number of rows and "n" denotes a number of columns). When there are multiple word line addresses having a match between the search data and the stored data, the priority encoder 160 outputs the address of the least significant bit only. Hence, no information indicating other word line addresses in which the search data also matches the stored data is produced.

To determine if there is an error in the CAM cell array 110 connected to the word lines, identical data, for example, "00", is written to the first through m-1$^{th}$ word lines, and, for example, "01", is written to the m$^{th}$ word line. Then, it is determined whether the priority encoder 160 outputs the address of the m$^{th}$ word line when "01" is used as the search data. Then, "00" is written to the first through m-2$^{th}$ word lines, and "01" is written to both the m-1$^{th}$ and the m$^{th}$ word lines. Then, it is determined whether the priority encoder 160 outputs the address of the m-1$^{th}$ word line when "01" is used as the search data. If there is no error in the CAM cells connected to the m-1$^{th}$ word line in the CAM cell array 110, the priority encoder 160 will output the address of the least significant bit. That is, of the addresses of the two word lines (the m$^{th}$ word line and the m-1$^{th}$ word line) in which the search data matches the stored data, the priority encoder 160 will output the address of the m-$^{th}$ word line.

In this way, all of the word lines up to the first word line are checked to determine if the CAM cell array 110 has an error. However, if an error does occur when using the priority encoder 160 to determine if the CAM cell array 110 has an error, it is difficult to determine whether the CAM cell array 110 or the priority encoder 160 causes the error. Even if it is the priority encoder 160, not the CAM cell array 110 that has an error, it may appear as though the CAM cell array 110 has the error. Thus, it is important to determine whether the priority encoder 160 has an error.

SUMMARY OF THE INVENTION

The present invention provides a content addressable memory (CAM) for detecting errors in a priority encoder and a method therefor.

According to an aspect of the present invention, there is provided a CAM including a CAM cell array having a plurality of CAM cells, a priority encoder, and a shift register unit.

The priority encoder tests the CAM cell array to determine if the CAM cell array has an error by comparing search data with data stored in the plurality of CAM cells. The shift register unit, in response to a clock signal, transmits first through m$^{th}$ test data to the priority encoder to test the priority encoder. Logic levels of the first through m$^{th}$ test data are sequentially changed in synchronization with the clock signal. If there are no errors in the priority encoder, the priority encoder sequentially outputs word line addresses of a most significant bit through a least significant bit of the CAM cell array.

The shift register unit sequentially generates the first through m$^{th}$ test data at one of a first level and a second level in response to the clock signal and includes first through m$^{th}$ shift registers connected in series. The first through m$^{th}$ shift registers are reset to the second level in response to a reset signal. The first shift register includes an input node connected to a power supply voltage, is reset in response to the reset signal and outputs the first test data in response to the clock signal.

According to another aspect of the present invention, there is provided a method of detecting an error in a priority encoder that compares search data with data stored in a CAM cell array and tests the CAM cell array based on the result of the comparison to determine if the CAM cell array has an error.

The method includes transmitting first through $m^{th}$ test data to the priority encoder in response to a clock signal, generating an output signal in response to the first through $m^{th}$ test data, and reading the output signal to determine if the priority encoder has an error. The logic levels of the first through $m^{th}$ test data are sequentially changed in synchronization with the clock signal. If it is determined that there are no errors in the priority encoder during the reading of the output signal, the priority encoder sequentially outputs word line addresses of a most significant bit through a least significant bit of the CAM cell array.

According to yet another aspect of the present invention, there is provided a content addressable memory, comprising: a content addressable memory cell array for storing data; a priority encoder for testing the content addressable memory cell array, wherein the priority encoder generates an output signal in response to test data; and a shift register unit for transmitting the test data to the priority encoder, wherein the test data is changed in synchronization with a clock signal.

The content addressable memory cell array comprises a plurality of content addressable memory cells. The shift register unit comprises a plurality of shift registers. The test data is transmitted at one of a high level and a low level in response to the clock signal. When there is no error detected in the content addressable memory cell array by the priority encoder, the output signal comprises word line addresses of a most significant bit through a least significant bit that are associated with the data stored in the content addressable memory cell array.

BRIEF DESCRIPTION OF THE DRAWINGS

The above and other features of the present invention will become more apparent by describing in detail exemplary embodiments thereof with reference to the attached drawings, in which.

DETAILED DESCRIPTION OF EXEMPLARY EMBODIMENTS

Figure 1:
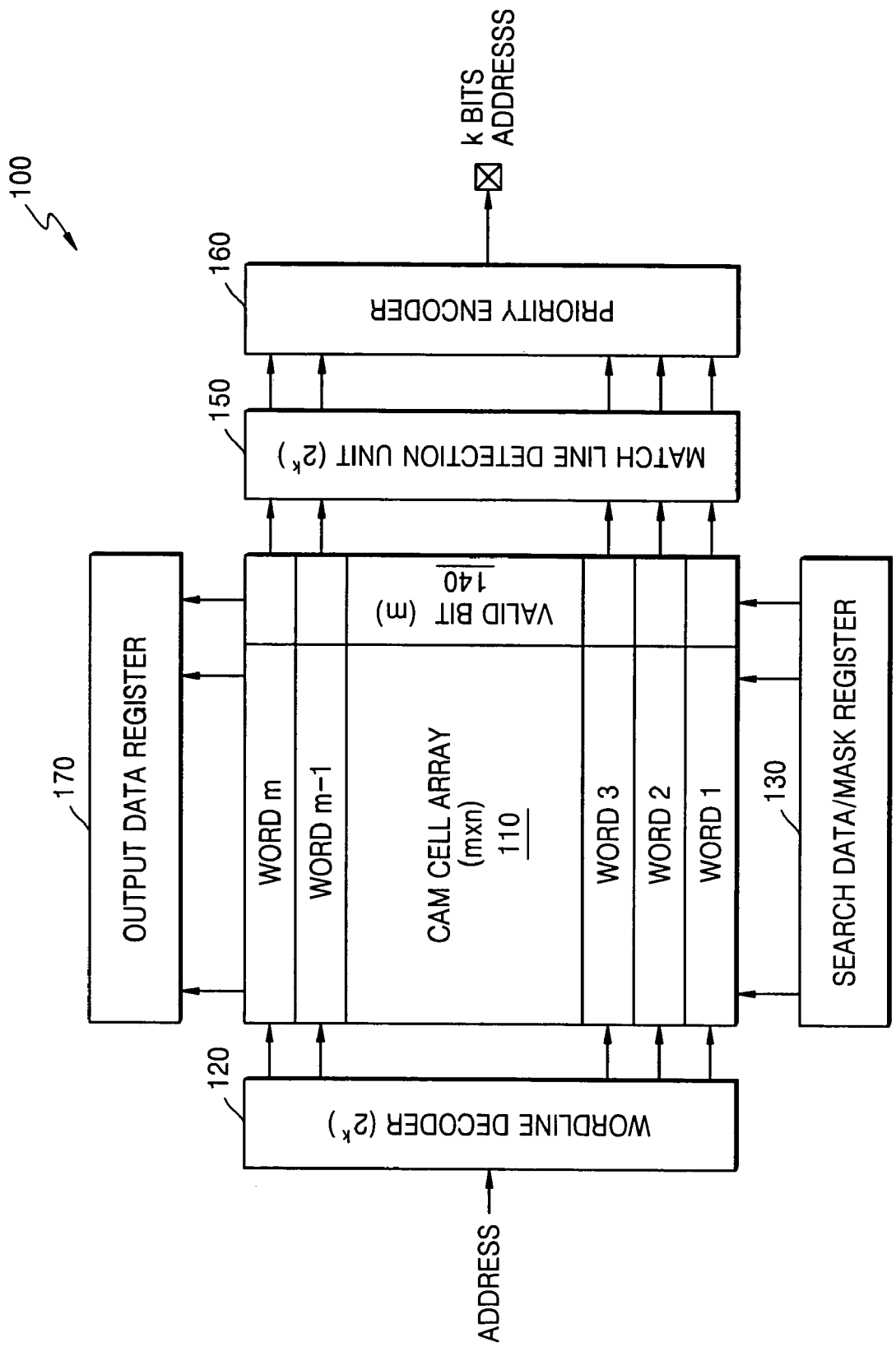
FIG. 1 illustrates the structure of a conventional content addressable memory (CAM)
Figure 2:
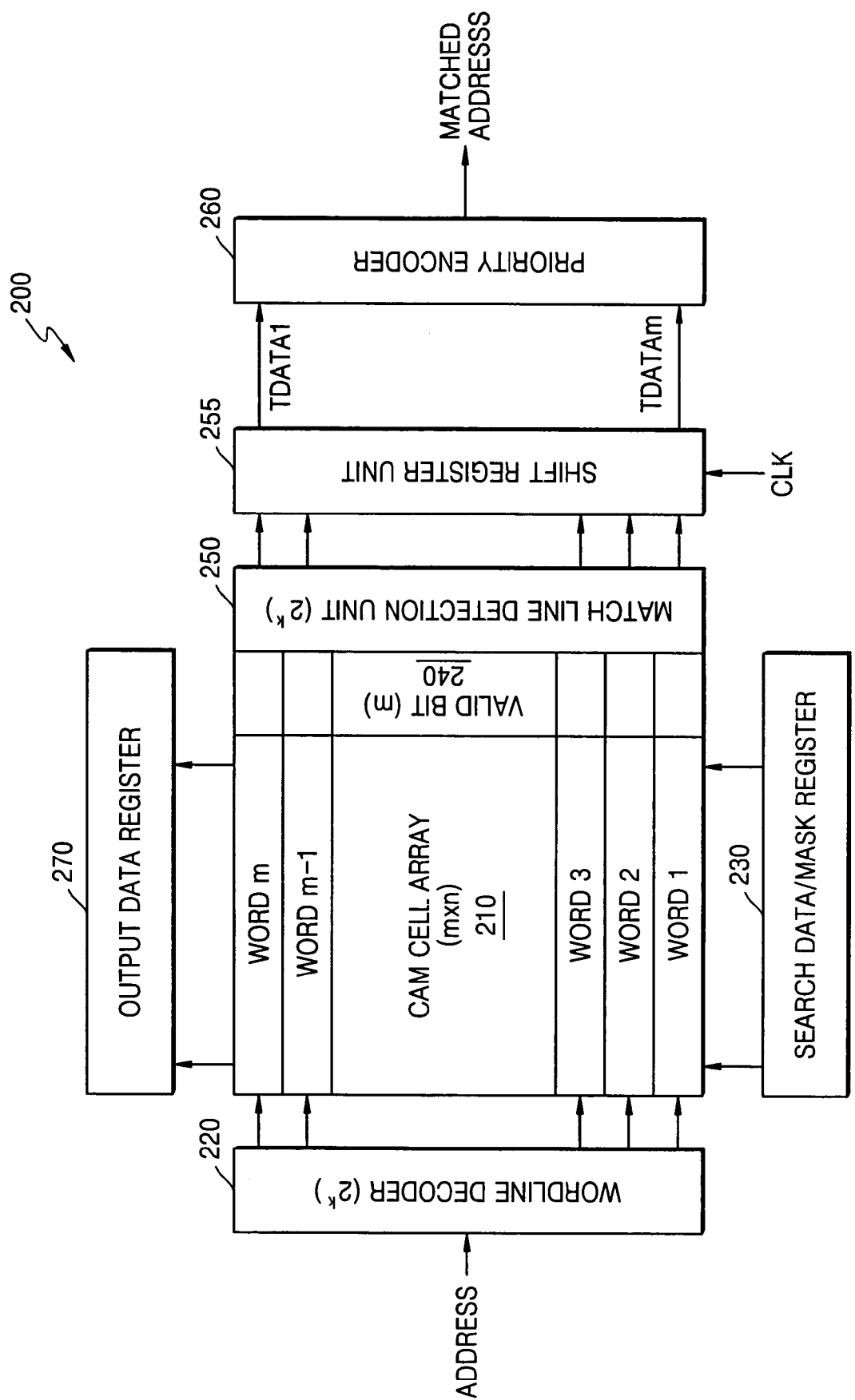
FIG. 2 illustrates the structure of a CAM according to an exemplary embodiment of the present invention.

FIG. 2 illustrates the structure of a content addressable memory (CAM) 200 according to an exemplary embodiment of the present invention. Referring to FIG. 2, the CAM 200 includes a search data/mask register 230, and a CAM cell array 210. The CAM cell array 210 comprises a plurality of CAM cells. The CAM 200 also includes a match line detection unit 250, and a shift register unit 255 for detecting an error in a priority encoder 260, where the sift register unit 255 is connected between the priority encoder 260 and the match line detection unit 250. The CAM 200 further includes an output data register 270 and a wordline decoder 220.

Figure 3:
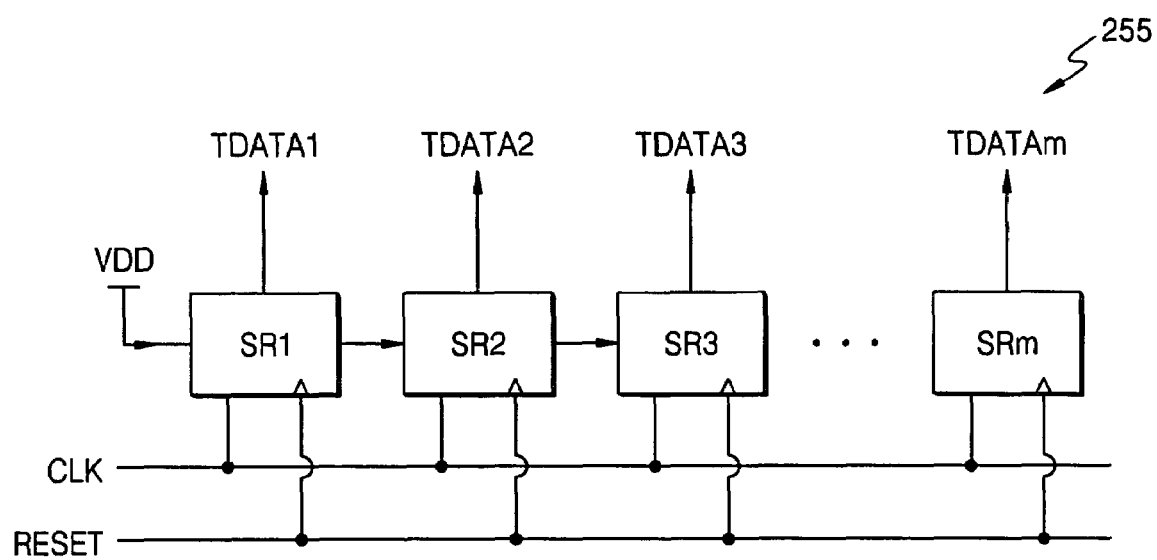
FIG. 3 illustrates a circuit diagram of a shift register unit of FIG. 2.
Figures 4A, 4B, 4C:
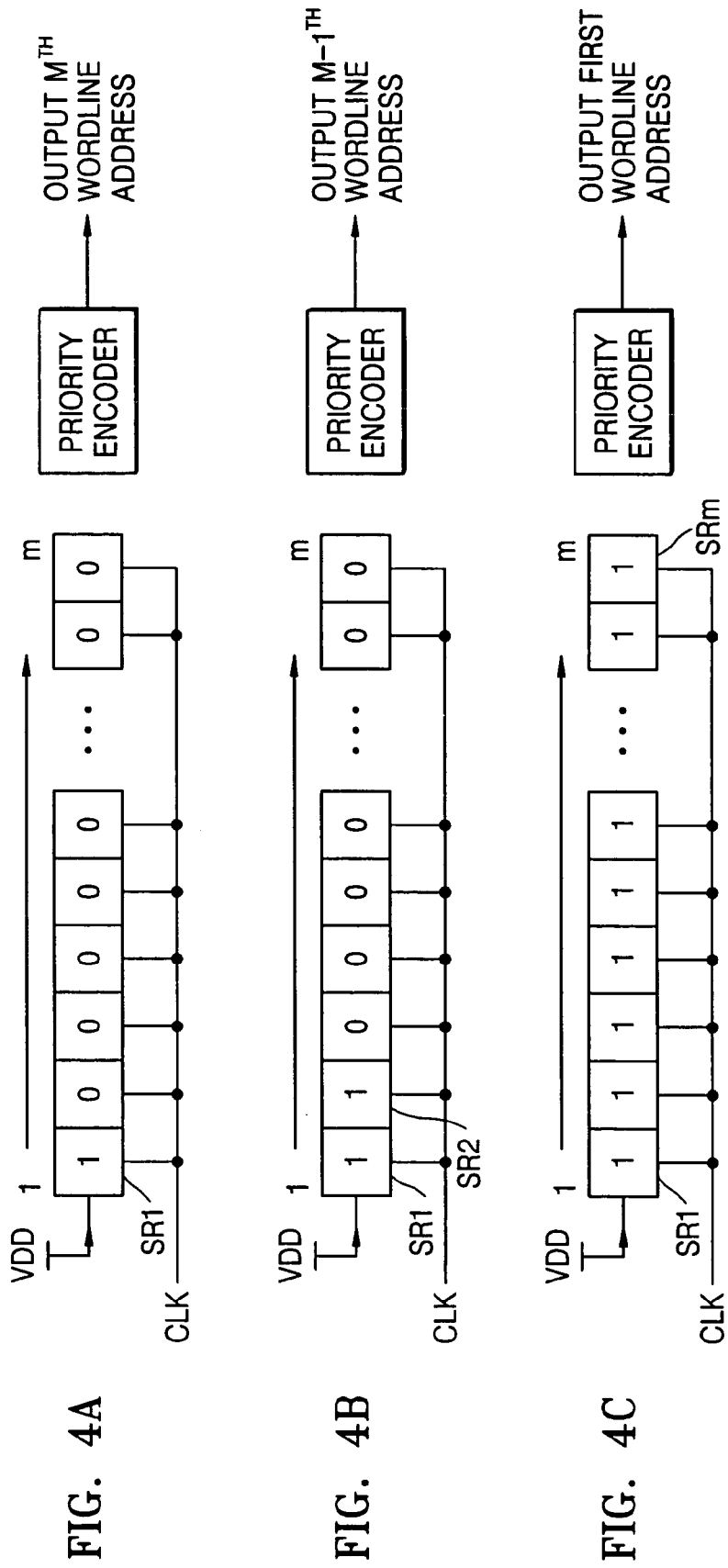
FIGS. 4A through 4C illustrate a method of detecting errors in a priority encoder using the shift register unit of FIG. 3.
Figure 5:
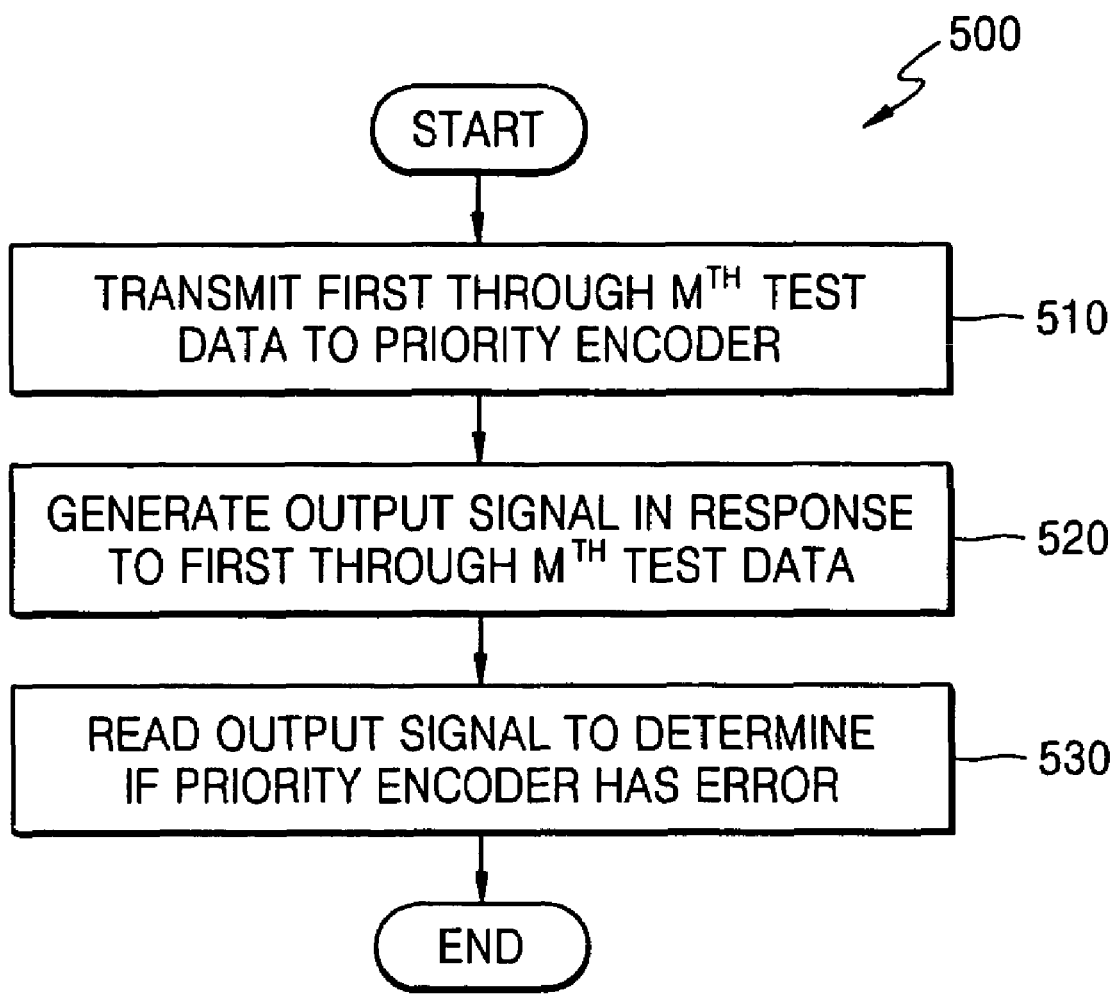
FIG. 5 is a flow chart illustrating a method of detecting errors in the priority encoder according to an exemplary embodiment of the present invention.

FIG. 3 illustrates a circuit diagram of the shift register unit 255 of FIG. 2. FIGS. 4A through 4C illustrate a method of detecting errors in the priority encoder 260 of FIG. 2 using the shift register unit 255. FIG. 5 is a flow chart illustrating a method of detecting errors in the priority encoder 260 according to an exemplary embodiment of the present invention.

Referring to FIG. 5, first through $m^{th}$ test data are transmitted to the priority encoder 260 in response to a clock signal CLK (Step 510). An output signal is generated in response to the first through $m^{th}$ test data (Step 520). Then the output signal is read to determine if the priority encoder 260 has an error (Step 530). That is, the shift register unit 255, in response to the clock signal CLK, transmits first through $m^{th}$ test data TDATA 1 through TDATAm to the priority encoder 260.

Assuming that one block of the CAM cell array 210 is composed of m×n cells (where "m" denotes a number of rows and "n" denotes a number of columns), the number of word line addresses is "m". Accordingly, the number of test data applied to the priority encoder 260 is also "m".

Referring to FIG. 3, the shift register unit 255 includes first through $m^{th}$ shift registers SR1 through SRm connected in series. For the sake of convenience, in the following discussion, a first level will be referred to as a high level (e.g., '1') and a second level as a low level (e.g., '0'). The first shift register SR1, whose input node is connected to a power supply voltage VDD, is reset in response to a reset signal RESET and outputs first test data TDATA1 in response to the clock signal CLK. The second shift register SR2 receives the first test data TDATA1 of the first shift register SR1 and outputs second test data TDATA2 in response to the clock signal CLK. In this way, the $m^{th}$ shift register SRm receives the output of an m-$1^{th}$ shift register SRm-$1^{th}$ (not shown) and outputs $m^{th}$ test data TDATAm in response to the clock signal CLK.

Then, the first through $m^{th}$ shift registers SR1 through SRm are reset to a second level, in response to the reset signal RESET. In other words, the first through $m^{th}$ shift registers SR1 through SRm are reset to a low level, in response to the reset signal RESET. In response to the power supply voltage VDD, the first shift register SR1 stores high-level data and then outputs the first test data TDATA1 at a high level. In response to the clock signal CLK, the first shift register SR1 transmits the first test data TDATA1 to the second shift register SR2. Thus, the second shift register SR2 also stores high-level data. The second shift register SR2 generates the second test data TDATA2 at a high level and transmits it to the third shift register SR3. Accordingly, the logic levels of the first through $m^{th}$ test data TDATA1 through TDATAm are sequentially changed from a low level to a high level, in synchronization with the clock signal CLK. Finally, the priority encoder 260 sequentially generates an output signal in response to the first through $m^{th}$ test data TDATA1 through TDATAm (Step 520).

Referring to FIG. 4A, the first shift register SR1 generates the first test data TDATA1 at a high level while the remaining second through $m^{th}$ shift registers SR2 through SRm generate second through $m^{th}$ test data TDATA2 through TDATAm at a low level. Then, the priority encoder 260 outputs an $m^{th}$ word line address in response to the first test data TDATA1 received at a high level.

Referring to FIG. 4B, in response to the clock signal CLK, the first shift register SR1 and the second shift register SR2 generate the first test data TDATA1 and the second test data TDATA2 at a high level. The third through $m^{th}$ shift registers SR3 through SRm generate third through $m^{th}$ test data TDATA 3 through TDATAm at a low level. Then, the priority encoder 260 outputs an m-1$^{th}$ word line address in response to the second test data TDATA2 received at a high level.

The priority encoder 260 may then output the word line address of the least significant bit of word line addresses in which the search data matches the stored data.

Because the first test data TDATA1 and the second test data TDATA2 are transmitted to the priority encoder 260 at a high level, the priority encoder 260 determines if CAM cells connected to word line addresses corresponding to the first test data TDATA1 and the second test data TDATA2 have no errors.

The corresponding word line address of the first test data TDATA1 is the m$^{th}$ word line address, and that of the second test data TDATA2 is the m-1$^{th}$ word line address. When the first and second shift registers SR1 and SR2 output the first and second test data TDATA1 and TDATA2 at a high level, the m-1$^{th}$ word line address is outputted from the priority encoder 260 because the m-1$^{th}$ word line address has the least significant bit.

In this way, during "m" cycles of the clock signal CLK, the first through m$^{th}$ shift registers SR1 through SRm generate all of the first through m$^{th}$ test data TDATA1 through TDATAm at a high level in response to the clock signal CLK.

Referring to FIG. 4C, the priority encoder 260 outputs a first word line address. The priority encoder 260, if there are no errors, sequentially outputs word line addresses of the most significant bit (MSB) through the least significant bit (LSB) in the CAM cell array 210. However, the priority encoder 260, if there are errors, fails to output some of the word line addresses of the MSB through LSB.

Thus, proper operation of the priority encoder 260 can be determined by sequentially changing the logic level of each of the first through m$^{th}$ test data TDATA1 through TDATAm transmitted from the shift register unit 255 to the priority encoder 260 from a low level to a high level and observing word line addresses outputted from the priority encoder 260.

This method of finding an error in the priority encoder 260 according to an exemplary embodiment of the present invention does not require continually writing data to the CAM cell array 110 and searching for a match by comparing search data with data stored in the CAM cell array 110. While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A content addressable memory comprising:
a content addressable memory cell array including a plurality of content addressable memory cells;
a priority encoder for testing the content addressable memory cell array to determine if there is an error in the content addressable memory cell array by comparing search data fed to the memory cell array with data stored in the plurality of content addressable memory cells; and
a shift register unit, operable in response to a clock signal fed thereto, for transmitting first through m-th independent test data to the priority encoder for independently testing the priority encoder to determine if there is an error in the priority encoder, wherein logic levels of the first through m-th independent test data from the shift register unit are sequentially changed in synchronization with the clock signal and fed to the priority encoder without being written to the memory cell array, whereby the priority encoder generates outputs in response to the first through m-th independent test data.

2. The content addressable memory of claim 1, wherein, if there is no error in the priority encoder, the priority encoder sequentially outputs m-th through first word line addresses of a most significant bit corresponding to the first test data through a least significant bit corresponding to the m-th test data of the content addressable memory cell array.

3. The content addressable memory of claim 1, wherein the shift register unit sequentially generates the first through m-th test data at one of a first level and a second level in response to the clock signal and comprises first through m-th shift registers connected in series.

4. The content addressable memory of claim 3, wherein the first through m-th shift registers are reset to the second level in response to a reset signal.

5. The content addressable memory of claim 4, wherein the first shift register includes an input node connected to a power supply voltage, is reset in response to the reset signal, and outputs the first test data in response to the clock signal.

6. A method of identifying an error in a priority encoder that compares search data with data stored in a content addressable memory cell array and tests the content addressable memory cell array based on the result of the comparison to determine if the content addressable memory cell array has an error, the method comprising:
transmitting first through m-th independent test data to the priority encoder in response to a clock signal;
generating output signals from the priority encoder corresponding to m-th through first word line addresses of the content addressable memory in response to the first through m-th independent test data; and
reading the generated output signals to determine if the priority encoder has an error, wherein if the priority encoder has errors therein corresponding ones of the m-th through first outputs will not be generated.

7. The method of claim 6, wherein the logic levels of the first through m-th test data are sequentially changed in synchronization with the clock signal.

8. The method of claim 6, wherein, if it is determined that there is no error in the priority encoder during the reading of the output signals, the priority encoder sequentially outputs each of the word line addresses of a most significant bit through a least significant bit of the content addressable memory cell array.

9. A content addressable memory, comprising:
a content addressable memory cell array for storing data;
a priority encoder for testing the content addressable memory cell array, wherein the priority encoder generates an output signal in response to search data to test the content addressable memory; and
a shift register unit for transmitting independent test data to the priority encoder for testing the priority encoder to determine if there is an error in the priority decoder, wherein the independent test data is changed in synchronization with a clock signal and changes first to m-th independent test data corresponding to word line addresses of the content addressable memory array. wherein if there are errors in the priority encoder corresponding ones of the m-th through first word line addresses will not be output.

10. The content addressable memory of claim 9, wherein the content addressable memory cell array comprises a plurality of content addressable memory cells.

11. The content addressable memory of claim 9, wherein the shift register unit comprises a plurality of shift registers.

12. The content addressable memory of claim 9, wherein the test data is transmitted at one of a high level and a low level in response to the clock signal.

13. The content addressable memory of claim 9, wherein when there is no error detected in the priority encoder, an output signal from the priority encoder in response to the test data from the shift register unit comprises an m-th word line address of a most significant bit through a first word line address of a least significant bit that are associated with the data stored in the content addressable memory cell array.

* * * * *